(12) United States Patent
Dierre et al.

(10) Patent No.: US 9,419,169 B2
(45) Date of Patent: Aug. 16, 2016

(54) METHOD FOR PRODUCING A SEMICONDUCTOR ELEMENT OF A DIRECT-CONVERTING X-RAY DETECTOR

(71) Applicant: SIEMENS AKTIENGESELLSCHAFT, Munich (DE)

(72) Inventors: Fabrice Dierre, Granville (FR); Peter Hackenschmied, Nuremberg (DE); Matthias Strassburg, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 365 days.

(21) Appl. No.: 13/973,038

(22) Filed: Aug. 22, 2013

(65) Prior Publication Data
US 2014/0054734 A1  Feb. 27, 2014

(30) Foreign Application Priority Data

Aug. 23, 2012  (DE) .......................... 10 2012 215 041

(51) Int. Cl.
| | |
|---|---|
| H01L 31/18 | (2006.01) |
| H01L 31/0296 | (2006.01) |
| H01L 31/0224 | (2006.01) |
| H01L 31/115 | (2006.01) |
| C23C 18/16 | (2006.01) |

(Continued)

(52) U.S. Cl.
CPC ........ H01L 31/1828 (2013.01); C23C 18/1605 (2013.01); C23C 18/1651 (2013.01); H01L 31/0224 (2013.01); H01L 31/0296 (2013.01); H01L 31/115 (2013.01); C23C 18/1648 (2013.01)

(58) Field of Classification Search
CPC .. H01L 31/1828; H01L 31/0296; H01L 21/06
USPC .................. 250/371, 370.09, 370.14, 370.13, 250/370.01; 438/678, 102, 685
See application file for complete search history.

(56) References Cited

U.S. PATENT DOCUMENTS

| | | | |
|---|---|---|---|
| 8,247,325 B2 * | 8/2012 | Sun ...................... | C23C 18/1642 257/E21.002 |
| 2004/0129994 A1 * | 7/2004 | Moriyama ...... | H01L 31/022408 257/471 |
| 2010/0019334 A1 * | 1/2010 | Ivanov .................. | H01L 31/032 257/432 |
| 2010/0127182 A1 * | 5/2010 | Hackenschmied ....... | G01T 1/00 250/370.09 |
| 2012/0045868 A1 * | 2/2012 | Ayoub .................... | H01L 29/45 438/102 |
| 2013/0049146 A1 | 2/2013 | Dierre et al. | |

FOREIGN PATENT DOCUMENTS

DE  102011081322 A1  2/2013

OTHER PUBLICATIONS

German Office Action 10 2012 215 041.2 dated Jul. 11, 2013.

* cited by examiner

*Primary Examiner* — David Porta
*Assistant Examiner* — Djura Malevic
(74) *Attorney, Agent, or Firm* — Harness, Dickey & Pierce

(57) ABSTRACT

A production method of a semiconductor element of a direct-converting x-ray detector is disclosed, wherein at least one intermediate layer is applied to a semiconductor layer and at least one contact layer is applied to an exposed intermediate layer by chemically currentless deposition of a contact material from a solution in each instance. The materials for the individual layers are selected such that the electrochemical potential of the materials of the at least one intermediate layer is greater than the electrochemical potential of at least one element of the semiconductor layer and the electrochemical potential of the contact material of the contract layer is greater than the electrochemical potential of the materials of the intermediate layers. Semiconductor elements produced in accordance with the method, an x-ray detector with semiconductor elements, an x-ray system with an x-ray detector and also a CT system with an x-ray detector are also disclosed.

25 Claims, 4 Drawing Sheets

METHOD FOR PRODUCING A SEMICONDUCTOR ELEMENT OF A DIRECT-CONVERTING X-RAY DETECTOR

PRIORITY STATEMENT

The present application hereby claims priority under 35 U.S.C. §119 to German patent application number DE 102012215041.2 filed Aug. 23, 2012, the entire contents of which are hereby incorporated herein by reference.

FIELD

At least one embodiment of the invention generally relates to a method for producing a semiconductor element of a direct-converting x-ray detector, wherein a semiconductor layer is generated on the basis of elements of the groups II to VI (containing the groups IIA, IIB, IIIA, IIIB, IVA, IVB, VA, VB, VIA, VIB according to CAS and/or the groups 2-6 and 12-16 according to IUPAC), at least one intermediate layer is applied by way of chemical currentless deposition of the material of the intermediate layer from a solution, with which the semiconductor layer is wetted, and a contact layer is deposited on a last intermediate layer by chemical currentless deposition of a contact material from a solution with which the semiconductor substrate is wetted.

Further, at least one embodiment of the invention also generally relates to semiconductor elements of a direct-converting x-ray detector, which are produced by such a method and/or to an x-ray detector with such semiconductor elements, an x-ray detector with such an x-ray detector and/or a CT system with such an x-ray detector.

BACKGROUND

Methods for producing semiconductor elements for direct-converting x-ray detectors are generally known. One problem in such semiconductor elements for direct-converting x-ray detectors essentially consists in optimal homogeneity and stability of the detector response still not having been achieved over time.

SUMMARY

At least one embodiment of the invention is directed to a method for producing semiconductor elements for direct-converting x-ray detectors, by which the homogeneity and stability of the detector response of such detectors over time can be improved.

Advantageous developments of the invention form the subject matter of the subclaims.

The inventors propose, in at least one embodiment, a method for producing a semiconductor element of a direct-converting x-ray detector, comprising:

generating a semiconductor layer on the basis of elements of the groups II to VI—this corresponds to the groups IIA, IIB, IIIA, IIIB, IVA, IVB, VA, VB, VIA, VIB according to CAS and/or the groups 2-6 and 12-16 according to IUPAC—, applying at least one intermediate layer by chemical currentless deposition of the material of the intermediate layer from a solution, with which the semiconductor substrate is wetted, and applying a contact layer by chemical currentless deposition of a contact material from a solution with which the semiconductor substrate is wetted.

Aside from at least one embodiment of the inventive production method, the scope of at least one embodiment of the invention also includes semiconductor elements for direct-converting x-ray detectors, which were produced in accordance with at least one embodiment of the previously cited method.

Similarly, at least one embodiment of the invention also includes an x-ray detector with such semiconductor elements and an x-ray system with such an x-ray detector and also a CT system with such an x-ray detector.

BRIEF DESCRIPTION OF THE DRAWINGS

The invention is described in more detail below on the basis of the preferred exemplary embodiments with the aid of the figures, wherein only the features required to understand the invention are shown. The following reference characters are used: A: first material; B: second material; C: third material; C1: CT system; C2: emitter; C3: x-ray detector; C6: gantry housing; C8: patient couch; C9: system axis; C10: computer system; HL: semiconductor layer; KS: contact layer; P: patient; Prg1-Prgn: computer programmes; ZL: intermediate level; ZS1 to ZS3: intermediate layers, in which, in detail.

DETAILED DESCRIPTION OF THE EXAMPLE EMBODIMENTS

Figure 1:
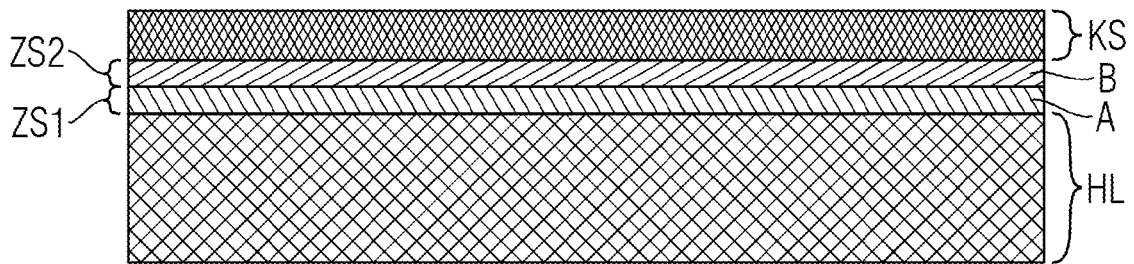
FIG. 1 shows a semiconductor with two intermediate layers and contact layer.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In order to be able to exploit the electronic advantages of direct-converting detectors such as II-VI compound semiconductors, for instance $Cd_xZn_{1-x}Te_ySe_{1-y}$ with $0 \leq x, y \leq 1$, or $Cd_xMn_{1-x}Te_ySe_{1-y}$ with $0 \leq x, y \leq 1$, ohmic contacts must be applied to the semiconductor, which when the semi conductors are used in detectors, generate a low leakage current, an extended electrical field profile and higher detector efficiency. The output of the direct-converting detectors based on II-VI compound semiconductors depends on the one hand on the electrical properties of the semiconductor and on the other hand on the ohmic contacts on the semiconductor and above all on the boundary surface between the contact material and the semiconductor. The skillful selection of favorable contact materials may influence the properties of the ohmic contacts such that these either inject charge carriers or block charge carriers. Similarly however, the used method of applying the contact material also influences the composition of a boundary layer and/or intermediate layer between the contact material and the semiconductor.

In comparison with other physical deposition methods, such as sputtering or thermal vaporization, a stronger chemical bond can be generated between a metallic contact material and a semiconductor, if a chemical currentless deposition is used as an ohmic contact in order to apply the contact material. The chemical currentless deposition previously had specific advantages in comparison with the other deposition methods, namely: this method is simple and quick, in other words can be implemented within a few minutes; impurities can be prevented and the formation of oxide layers prior to depositing the contact can be reduced; injecting contacts can be generated, with which the problem of polarization can be resolved; only low costs result; and the output of the detectors is improved.

The chemical currentless deposition is easier to implement than physical deposition methods and generates a stronger chemical bond between a contact layer and a semiconductor layer, which may consists of CdTe for instance, without the need for a curing process. However, previously only the four contact materials Au, Pt, Pd and In were known, wherein Au, Pt and Pd generate injecting p-type contacts and/or blocking n-type contacts, and In blocking p-type contacts and/or injecting n-type contacts.

The inventors have recognized that other single elements and/or materials of interest can also be deposited by means of a currentless deposition if the redox potential of the deposited elements and/or materials is exploited in order to create corresponding intermediate layers between the semiconductor layer and the outer-lying layer so that an intermediate-diffusing multilayer system is produced, in other words at least two layers are applied to the semiconductor. These multi-layer systems have the special feature that individual layers have a different electrochemical potential relative to one another (work function of the electrons) to the semiconductor and the single elements themselves. This produces other properties of the contacts and potentially brings about an improvement in the output of the detector.

Investigations are currently being performed into semiconductors, such as CdxZn1-xTeySe1-y with 0≤x, y≤1, and CdxMn1-xTeySe1-y with 0≤x, y≤1, wherein only Au, Pt, Pd and In are used as contact materials. Furthermore, other deposition methods, such as sputtering or vaporization, are also used in order to produce stacked or multilayer contacts. Nevertheless, the contacts generated with these methods do not feature the same properties as the contacts generated with the chemical currentless deposition method.

The inventors have identified that a multilayer system can be generated by means of a chemical currentless deposition method, if, when selecting the contact material and the at least one intermediate layer disposed between the semiconductor and contact layer, the electrochemical potential of the contact material, of the at least one intermediate layer and of the semiconductor, is taken into account so that the output of the detector is improved.

In order to influence which elements are deposited on the semiconductor or/and a previously deposited layer, the redox potential of the chemical reactions running during the deposition process is taken into account. The redox potential E0 in this way defines the readiness of a material to reduce and/or to oxidize. The ions contained in the currentless solution used, for instance $AuCl_4^-$ for Au or $PtCl_6^{2-}$ for Pt, which are strong oxidizers and/or have a strong oxidizing effect, will react with the strongest reducers from the semiconductor, thereby resulting in precipitation and deposits of the contact material. This reaction may take place in a step, in other words directly, or in a number of steps.

The selection of the pH value of the solution is also not insignificant here. For instance, with CdTE, the reduction is mainly performed by Cd in the case of an acidic pH value, and the reduction is mainly performed by Te in the case of an alkali pH value. This behavior is described in the thermodynamic equation for a standard hydrogen electrode. The typical, direct deposition of Au on CdTE can be defined with the following equation:

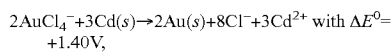
$$2AuCl_4^- + 3Cd(s) \rightarrow 2Au(s) + 8Cl^- + 3Cd^{2+} \text{ with } \Delta E^0 = +1.40V,$$

wherein $\Delta E^0$ is the difference of the redox potential of the respective reduction and oxidation elements, here Au and Cd. The positive difference of the redox potential means that the reaction takes place completely and correspondingly strongly in one direction or displaced toward a reduction performer.

Similarly, the gradual deposition reaction of Pt can be defined with the following equations:

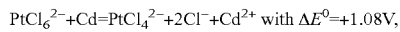
$$PtCl_6^{2-} + Cd = PtCl_4^{2-} + 2Cl^- + Cd^{2+} \text{ with } \Delta E^0 = +1.08V,$$

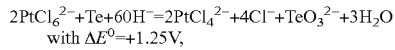
$$2PtCl_6^{2-} + Te + 6OH^- = 2PtCl_4^{2-} + 4Cl^- + TeO_3^{2-} + 3H_2O \text{ with } \Delta E^0 = +1.25V,$$

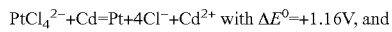
$$PtCl_4^{2-} + Cd = Pt + 4Cl^- + Cd^{2+} \text{ with } \Delta E^0 = +1.16V, \text{ and}$$

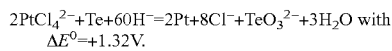
$$2PtCl_4^{2-} + Te + 6OH^- = 2Pt + 8Cl^- + TeO_3^{2-} + 3H_2O \text{ with } \Delta E^0 = +1.32V.$$

The structure of the layers on a semiconductor substrate can be generated for instance as a sequence of layers with the following features:

With the first intermediate layer, which rests directly on the semiconductor substrate, provided the solution used contains oxidizing ions A, its redox potential may be greater than the redox potential of the elements Cd and/or Te. The ions A will then react with the atoms from the semiconductor layer, e.g. with the Cd atoms. Here the atoms of the semiconductor layer, e.g. the Cd atoms, are substituted by the A atoms, wherein the reduction performers, e.g. the Cd atoms, go into the solution and the ions A go out of the solution, e.g. the platinum ions are deposited as the first intermediate layer on the surface of the semiconductor.

In order to generate the subsequent layers, the semiconductor can be immersed in each instance into another chemical solution, wherein the solution contains an oxidizing element B, which has a greater redox potential than the element A. The ions B will then react with the fixed ions A of the first layer on the semiconductor, wherein An+-ions remain in the solution and the ions B precipitate on the semiconductor and/or the contact. This preferred precipitation from B to A results in the formation of flaws of A on the surface of the detector and subsequently in a mixed layer comprising both elements A and B, as a result of which a new intermediate layer embodied as an alloy is produced.

The immersion and deposition of the second element B can be repeated with different materials in order to generate an alloy from a number of elements.

In accordance with at least one embodiment of the invention, to this end ions are proposed which have a greater redox potential than that of the semiconductor and the already applied layers, if necessary materials already implied in a mixed alloy layer. If CdTe is used as a semiconductor, the oxidizing elements have a greater redox potential than $E0=-0.57 V$.

At least one embodiment of the inventive method can also be used in conjunction with other methods, such as photolithography or etching etc, in order to produce detectors with different geometries, for instance planar, pixelated or semispherical geometries.

Direct-converting detectors produced according to an embodiment of this inventive production method exhibit particularly good values in respect of their homogeneity and stability of detector response over time, in other words a minimal drift in the count rate as a function of time.

The inventors propose, in at least one embodiment, a method for producing a semiconductor element of a direct-converting x-ray detector, comprising:

generating a semiconductor layer on the basis of elements of the groups II to VI—this corresponds to the groups IIA, IIB, IIIA, IIIB, IVA, IVB, VA, VB, VIA, VIB according to CAS and/or the groups 2-6 and 12-16 according to IUPAC—, applying at least one intermediate layer by chemical currentless deposition of the material of the intermediate layer from a solution, with which the semiconductor substrate is wetted, and applying a contact layer by chemical currentless deposition of a contact material from a solution with which the semiconductor substrate is wetted.

In the method of an embodiment of the invention, materials for the individual layers are used such that the electrochemical potential of the materials of the at least one intermediate layer is larger than the electrochemical potential of the at least one element of the semiconductor layer and the electrochemical potential of the contact material of the contact layer is greater than the electrochemical potential of the materials of the intermediate layers.

It is therefore proposed, in at least one embodiment, to select the materials of the individual layers to be applied such that their electrochemical potential, in other words the work function of the electrons, increases successively from layer to layer, in other words from applied material to applied material from the semiconductor layer to the contact layer. If this method is considered in respect of its temporal sequence, in which the individual materials are applied by way of currentless deposition, this statement also corresponds to the case that the material subsequently deposited on the semiconductor is in each case to exhibit an increasingly greater electrochemical potential.

The electrochemical potential or work function of a material is defined here as the work which has to be expended in order to release an electron from an uncharged solid body of this material. The electrochemical potential is generally specified in eV (electron volt). Furthermore, reference is made to the term "currentless", meaning that no external current or voltage source is applied to the system. The charge motion generated by internal electron exchange of the elements during deposition is not taken into account in the case of the term "currentless".

It is advantageous if the first intermediate layer applied directly to the semiconductor layer is applied with a solution of the material of the first intermediate layer, wherein the redox potential of the "dissolved" material of the first intermediate layer is greater than the redox potential of at least one of the elements of the semiconductor layer.

It is also advantageous if the first intermediate layer applied directly to the semiconductor layer is applied with a solution of the material of the first intermediate layer to be applied, wherein the redox potential of the material of the first intermediate layer is greater than the redox potential of all elements of the semiconductor layer.

For every further applied intermediate layer with a solution of the material of the further intermediate layer, the redox potential of the material of the further intermediate layer should also be greater than the redox potential of the material of the preceding intermediate layer.

The contact material, which forms the contact layer, can also be applied with a release of the contact material, wherein the redox potential of the contact material is to be greater than the redox potential of the material of the preceding intermediate layer.

The afore-cited redox potential, also known as standard electrode potential, herewith describes a measure of the readiness of a material in the solution, in most instances a metal, to receive electrons in a chemical reaction and thus to act as an oxidizer.

It is also favorable if at least one metal, preferably exclusively metals, are used as the material of the intermediate layers.

It is also proposed that at least two, preferably precisely two or precisely three, intermediate layers of different elements are applied, which, with the aid of the intermediate layers applied layer by layer, overall form an intermediate layer made of the alloy of the different elements.

It is likewise possible for at least two, preferably precisely two or precisely three, intermediate layers of different materials to be applied, which form an alloy of the different materials at least in a border area of the layers. In a special embodiment, the layers can also be selected in respect of their thickness such that the materials of the respectively bordering layers exclusively mix to form alloys. The term materials is understood within the context of the invention to mean both individual chemical elements, and also inorganic or organic molecules. The essential aspect here is the electrochemical potential of these materials. As soon as their electrochemical potential has a difference with respect to the atoms in the semiconductor or an already deposited layer, the desired reaction is achieved.

A metal can preferably be selected as the contact material of the contact layer. With respect to the semiconductor material, it is particularly favorable if this contains Cd and Te, if necessary additionally Zn and/or Mn and/or Se. It is particularly preferred that the semiconductor material fulfills the formula $Cd_xMn_{1-x}Te_ySe_{1-y}$ with $0 \le x$, $y \le 1$ or $Cd_xZn_{1-x}Te_ySe_{1-y}$ with $0 \le x$, $y \le 1$.

Furthermore, the quantity of materials to be applied can be controlled by varying the residence time of the solutions. If only subareas of the semiconductor are exposed to the intermediate layers and/or the contact surface, only these subareas of the semiconductor can also be wetted with the solution, for instance also a subarea of the semiconductor can also be provided with a protective layer prior to wetting by a solution, so that no material deposits there. It is favorable here if the protective layer consists of a material which has a greater electrochemical potential than all other materials used.

It is therefore proposed to use a chemical currentless deposition method in at least one embodiment, in order to produce a multilayer system which has different advantages compared with the detectors produced using conventional methods. Here the deposition of the elements takes place easily and quickly within a few minutes, wherein two different solution are used for currentless deposition, which if necessary have the same solvent. Impurities can be avoided and the embodiment of oxide layers prior to depositing the contact can be reduced. As a function of the planned use of contacts, different contacts, in other words both injecting and also blocking contacts, can be generated. On account of the multilayer system, the electrochemical potential of the first contact is modified on the semiconductor, as a result of which the leakage current is reduced and the output of the detector is improved. The cost outlay with this deposition method is minimal compared with other methods.

Furthermore, a semiconductor can also be structured with the method according to at least one embodiment of the invention, in which the semiconductor material is at least partially encased in the manner of a sandwich on two opposing sides of the afore-described intermediate layers and a contact layer, wherein only one side is produced in accordance with the invention in a first embodiment. Alternatively, both sides can also be generated with at least one embodiment of the inventive method, wherein the structure of the two sides can be designed to be identical and also different.

Aside from at least one embodiment of the inventive production method, the scope of at least one embodiment of the invention also includes semiconductor elements for direct-converting x-ray detectors, which were produced in accordance with at least one embodiment of the previously cited method.

Similarly, at least one embodiment of the invention also includes an x-ray detector with such semiconductor elements and an x-ray system with such an x-ray detector and also a CT system with such an x-ray detector.

In order to better understand embodiments of the invention, FIGS. 1 to 7 show inventive semiconductor structures which are structured differently having contact layers arranged at least on one side and intermediate layers arranged between the contact layers and the semiconductor layer.

FIG. 1 shows a simple structure of a semiconductor structure comprising a direct-converting semiconductor layer HL, which essentially comprises Cd and Te. A first intermediate layer ZS1 made of a solution with a first material A and thereupon a second intermediate layer ZS2 with a material B was applied directly to the semiconductor layer HL. The contact layer KS made up of contact material follows directly thereon. In accordance with the invention, the material A was selected such that the electrochemical potential of the electrons from this material A lies between the electrochemical potential of the semiconductor elements and the electrochemical potential of the material B of the second intermediate layer ZS2. Furthermore, the second material B is selected such that the electrochemical potential of the second material B is greater than the electrochemical potential of the material A and is smaller than the electrochemical potential of the contact material.

Figure 2:
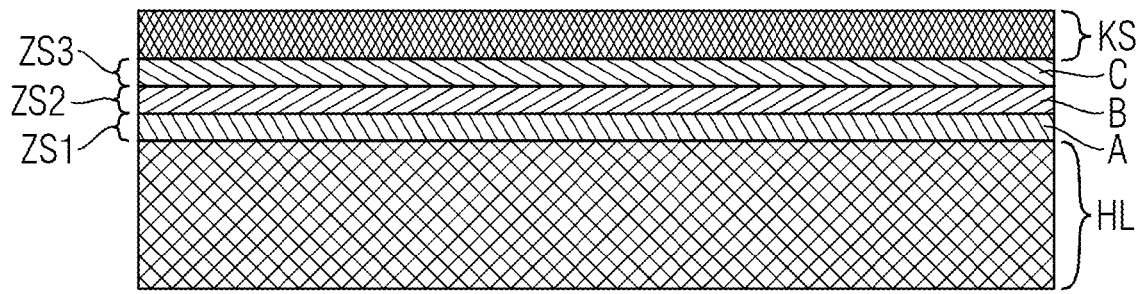
FIG. 2 shows a semiconductor with three intermediate layers and contact layer.

A similar variant of a semiconductor structure is shown in FIG. 2, wherein, contrary to the embodiment according to FIG. 1, three different intermediate layers ZS1, ZS2 and ZS3 with the materials A, B and C are used, which were all deposited in a currentless manner on the surface from solutions of the respective materials. The materials A, B and C are also herewith selected such that their electrochemical potential increases successively from the first to the last layer. Similarly, a solution of the respective materials A to C to be deposited is to be selected such that the redox potential of the materials A to C increases from layer to layer, in other words from deposition to deposition. This increasing sequence is also retained for the contact material deposited on the intermediate layers.

Figure 3:
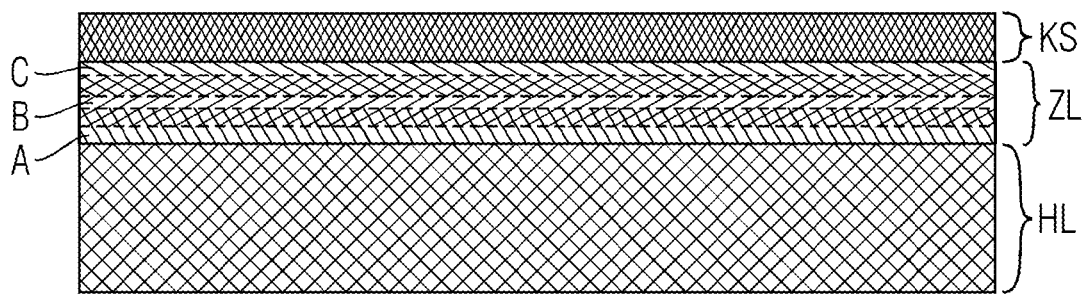
FIG. 3 shows a semiconductor with three intermediate layers and contact layer which diffuse partially into one another.

FIG. 3 shows a semiconductor structure, in which three intermediate layers ZS1 to ZS3 with the materials A to C were likewise deposited between semiconductor HL and contact layer KS, nevertheless the materials A and B and/or B and C have herewith been selected such that overlapping zones develop in the boundary layers, in which the materials A and B and/or B and C diffuse into one another.

Figure 4:
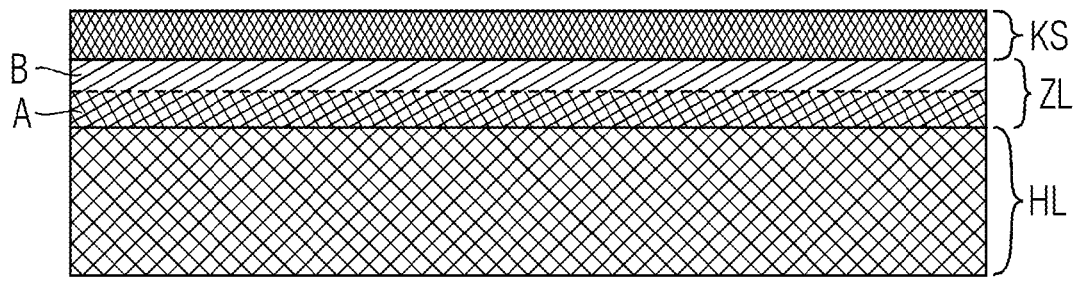
FIG. 4 shows a semiconductor with two intermediate layers and contact layer which diffuse into one another.

FIG. 4 shows a variant with two intermediate layers made up of the materials A and B, wherein the material B here diffuses fully into the layer of the material A, however one region remains on the contact layer KS, which exclusively comprises the material B so that no interaction occurs between A and the contact material.

Since with such intermediate layers which diffuse into one another the limits of the intermediate layers can no longer be determined clearly, the whole conglomeration produced therefrom is overall referred to as an intermediate level ZL. On account of the suitable selection of the materials deposited in series in a currentless manner, the properties of the direct-converting semiconductor can overall be influenced and improved.

Figure 5:
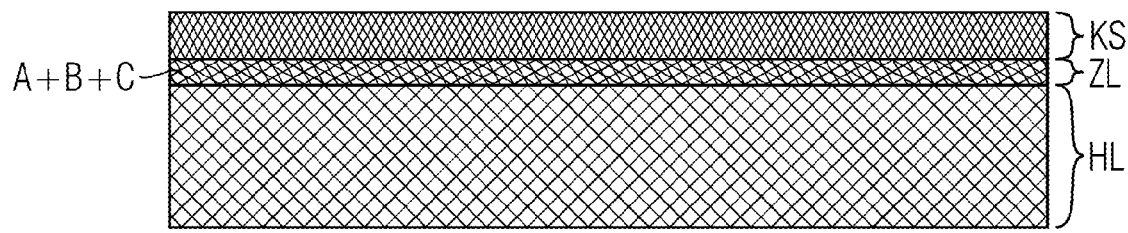
FIG. 5 shows a semiconductor with three intermediate layers and contact layer which diffuse fully into one another.

FIG. 5 shows an extreme variant of a semiconductor structure having an intermediate level, in which three different materials A to C were deposited in relatively thin layers, so that all three materials mix completely with one another and thus finally form a largely homogenous intermediate level ZL made of an ABC alloy.

Figure 6:
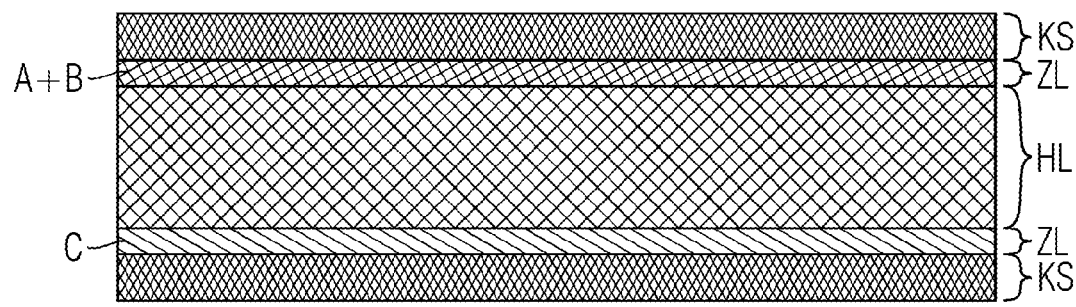
FIG. 6 shows a semiconductor with three intermediate layers and contact layer which diffuse fully into one another on one side and a simple intermediate layer with contact layer on the other.

While FIGS. 1 to 5 show semiconductor structures coated on one side, which under certain circumstances also only indicate intermediate products, a semiconductor structure is shown in FIG. 6, in which two, here opposing, sides of the semiconductor were coated in accordance with the invention. The upper side has an intermediate level ZL made of two intermediate layers which diffuse fully into one another having the materials A and B and an externally lying contact layer KS. A simple intermediate level ZSi with a material C and thereupon a contact layer was deposited in a currentless manner underneath. Within the scope of embodiments of the invention, a material can also be used in the lower intermediate layer, which already occurs in the upper intermediate layers.

Figure 7:
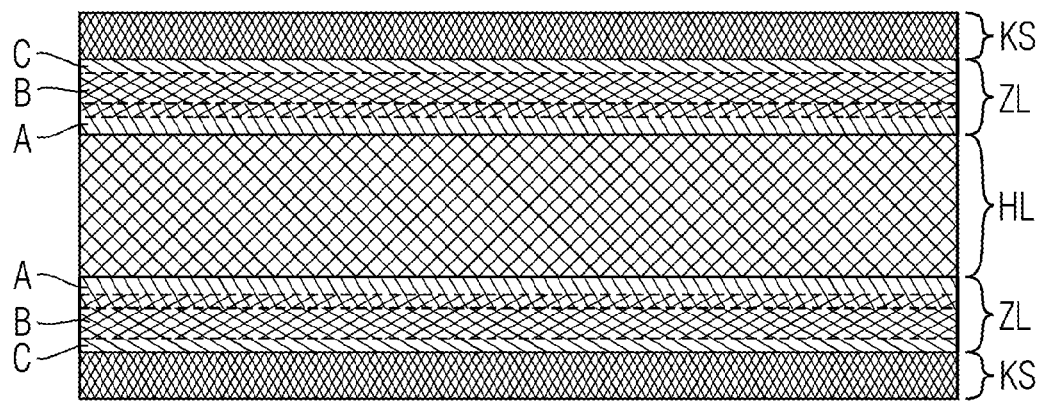
FIG. 7 shows a semiconductor with the same structure of intermediate layers and contact layer on both sides.

Another variant of a semiconductor structure is finally shown again in FIG. 7, in which the semiconductor layer HL is framed in the manner of a sandwich and symmetrically by three partially intermixing intermediate layers ZS1 to ZS3 with the materials A, B and C which each form the intermediate level ZL, wherein the contact layers KS above and below are arranged pointing outwards.

Figure 8:
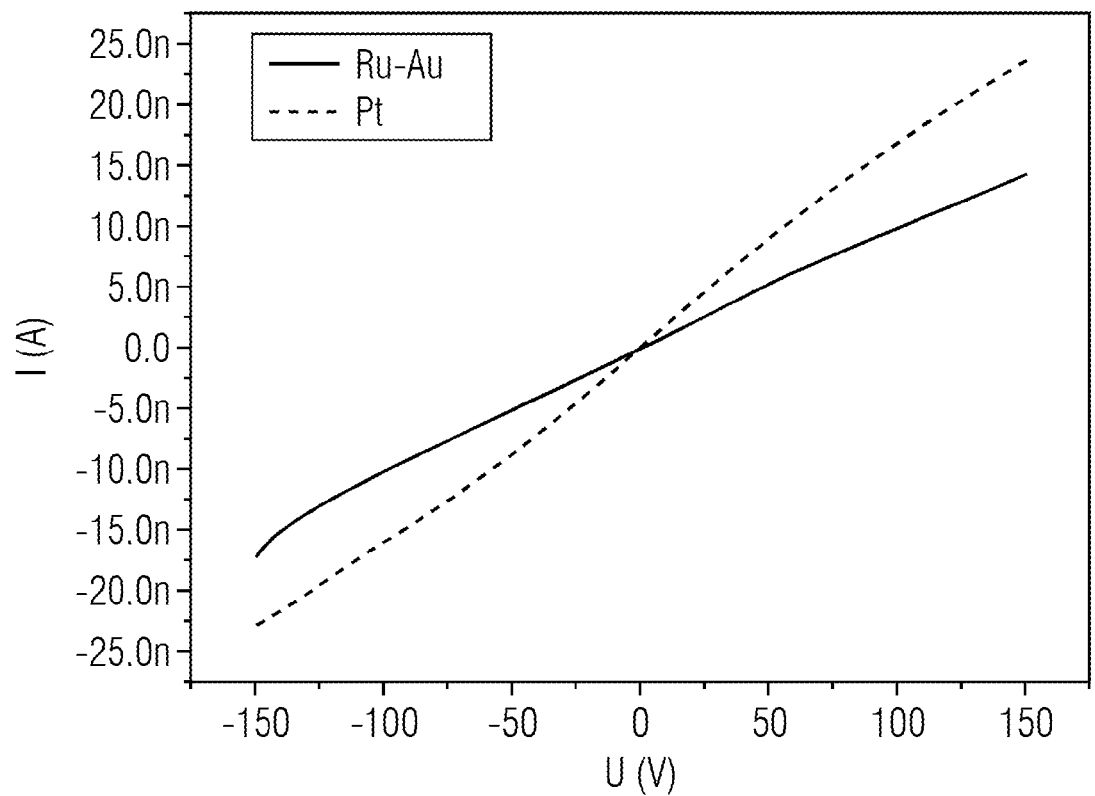
FIG. 8 shows a comparison of two semiconductors with intermediate layers made of Pt on one side and Ru-AU on the other.
Figure 9:
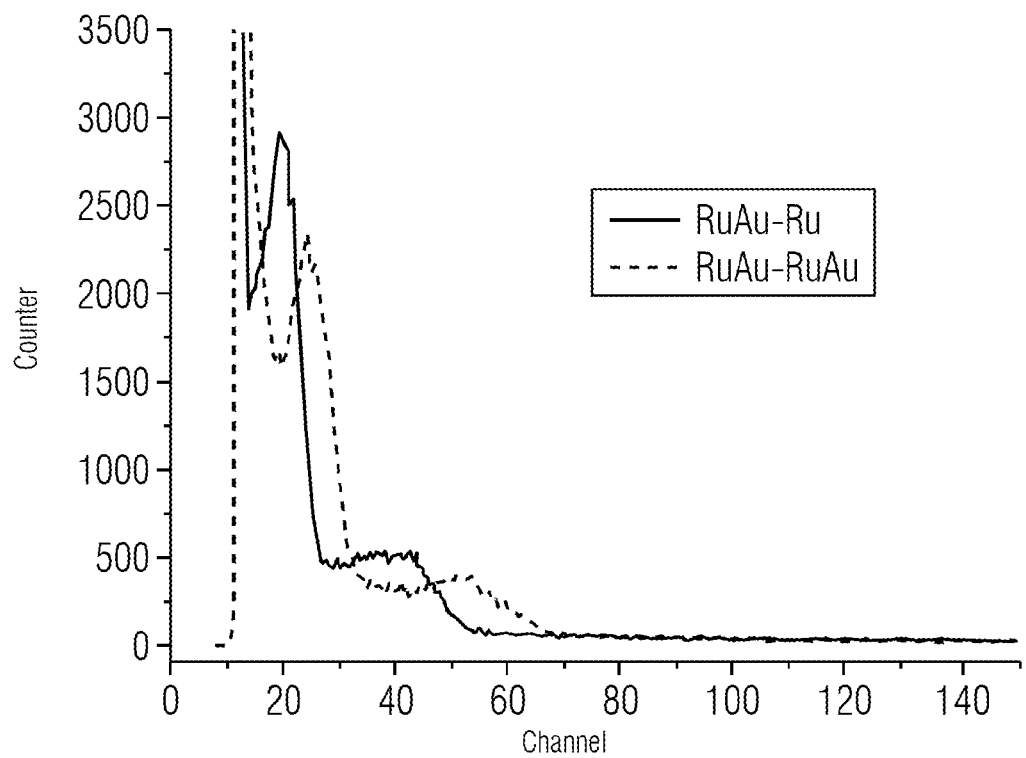
FIG. 9 shows a comparison of two semiconductors with intermediate layers arranged on both sides made of RuAu and Ru on one side and RuAu and RuAU on the other and FIG. 10 shows a CT system with an inventive detector structure.

The effect of an embodiment of the inventive production method on direct-converting semiconductor detectors is shown in FIGS. 8 and 9. FIG. 8 shows the current-voltage curves of the semiconductor, by way of example with the aid of a CdZnTe semiconductor, with an inventively applied Ru—Au intermediate layer on the one hand and a conventional individual Pt layer on the other hand. As is apparent, the curve with the Ru—Au intermediate layer runs straight up to the bend in the case of high negative voltages, whereas the curve for Pt shows a steeper course about 0V on account of the lower resistance in order then to level out. The ohmocity, in other words the following of the current-voltage characteristic curve according to Ohms' Law, is clearly better for Ru—Au. This allows improved detector behavior to be concluded.

FIG. 9 shows a comparison of the response behavior of two detectors with planar CdZnTe semiconductors having inventively generated RuAu layers on both sides on the one hand and an asymmetrical geometry comprising RuAU layers on one side and an Ru layer on the other side. This herewith shows that the pulse height for RuAu/Ru contacts is nevertheless somewhat higher than the signal response to a monoenergetic x-ray, but is also shifted at lower energy values (to the left). This means that a CdZnTe semiconductor with an RuAu—RuAu contact has a higher charge carrier collection efficiency than the same semiconductor with an RuAu Ru contact.

Figure 10:
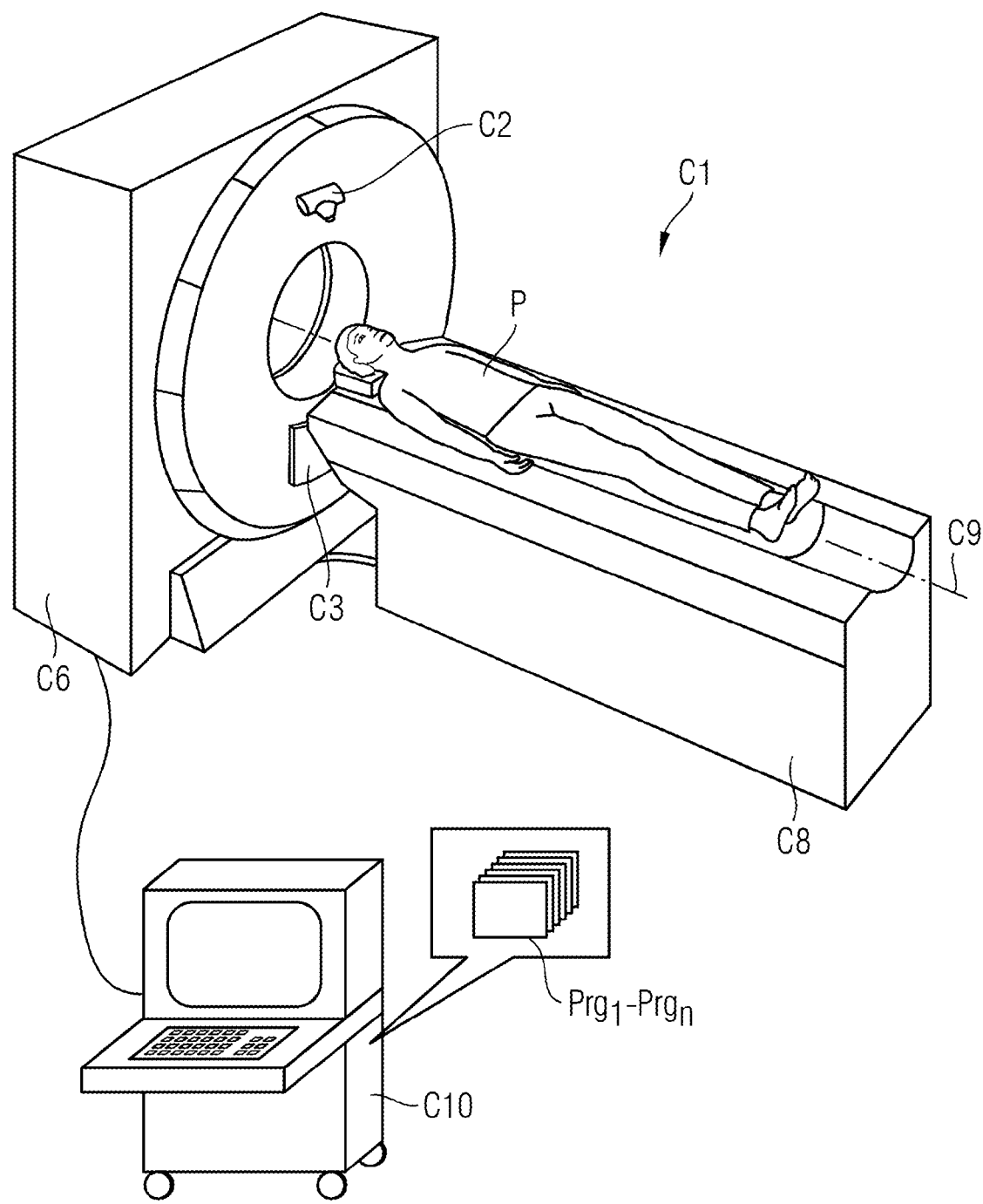

For the sake of completeness, FIG. 10 also shows a CT system C1, which usually has a gantry housing C6, in which a gantry rotates, on which an emitter-detector system, comprising an emitter C2 and an x-ray detector C3, is arranged. For measurement purposes, the patient P is moved along the system axis C9 with the aid of the patient couch C8 into the measurement field between the rotating emitter C2 and detector C3 and is scanned. This process and also the measurement including detector data preparation and reconstruction of the CT image data is controlled by the computer system C10 with the programs Prg1-Prgn. According to an embodiment of the invention, with this CT system 1, the detector C3 is provided with semiconductor elements, which were generated by the production method described before. On account of the property of the direct-converting semiconductor in conjunction with an energy-discrimination of the incident radiation, it is possible with such a detector alone to generate energy-resolved image data and thus for instance to embodied material breakdowns. Essential to the quality of such methods is however the performance of the semiconductor structures used, which can be significantly improved by the inventive production.

Although the invention was illustrated and described in more detail by the preferred exemplary embodiment, the invention is not restricted by the disclosed examples and other variations can be derived herefrom by the person skilled in the art without departing from the protective scope of the invention.

What is claimed is:
1. A method for producing a semiconductor element of a direct-converting x-ray detector, comprising:
generating a semiconductor layer on a basis of elements of groups II to VI;
applying at least one intermediate layer by chemical currentless deposition of material of the at least one intermediate layer from a solution, with which the semiconductor layer is wetted; and applying at least one contact layer to the at least one intermediate layer by chemical currentless deposition of a contact material from a solution with which the at least one intermediate layer is wetted, wherein materials for the semiconductor layer, the at least one intermediate layer and the at least one contact layer are used such that the electrochemical potential of the material of the at least one intermediate layer is relatively greater than the electrochemical potential of at least one element of the at least one semiconductor layer, and the electrochemical potential of the contact material of the at least one contact layer is relatively greater than the electrochemical potential of the material of the at least one intermediate layer.

2. The method of claim 1, wherein the applying at least one intermediate layer applies a first intermediate layer directly to the semiconductor layer with a solution of the material of the first intermediate layer, and a redox potential of the material of the first intermediate layer is relatively greater than a redox potential of at least one element of the at least one semiconductor layer.

3. The method of claim 2, wherein the redox potential of the material of the first intermediate layer is relatively greater than redox potentials of all elements of the at least one semiconductor layer.

4. The method of claim 3, wherein the applying at least one intermediate layer applies one or more additional intermediate layers with each further intermediate layer being applied with a solution of the material of the further intermediate layer, and the redox potential of the material of each of the one or more additional intermediate layers is relatively greater than redox potential of the material of the preceding one of the one or more additional intermediate layers.

5. The method of claim 2, wherein the applying at least one intermediate layer applies one or more additional intermediate layers with each further intermediate layer being applied with a solution of the material of the further intermediate layer, and the redox potential of the material of each of the one or more additional intermediate layers is relatively greater than redox potential of the material of the preceding one of the one or more additional intermediate layers.

6. The method of claim 2, wherein the applying at least one contact layer applies the at least one contact layer with a solution of the contact material, and a redox potential of the contact material is relatively greater than a redox potential of the material of the at least one intermediate layer.

7. The method of claim 1, wherein a metal is used as material of the at least one intermediate layer.

8. The method of claim 1, wherein the applying the at least one intermediate layer applies at least two intermediate layers of different elements, which form an intermediate level from an alloy of the different elements.

9. The method of claim 8, wherein the applying the at least one intermediate layer applies precisely three intermediate layers of different elements, which form an intermediate level from an alloy of the different elements.

10. The method of claim 1, the applying the at least one intermediate layer applies at least two intermediate layers of different elements, which form an alloy of the different materials, at least in a border region of the at least two intermediate layers.

11. The method of claim 10, wherein the applying the at least one intermediate layer applies precisely three intermediate layers of different elements are applied, which form an intermediate level from an alloy of the different elements.

12. The method of claim 1, wherein a metal is used as the contact material of the at least one contact layer.

13. The method of claim 1, wherein the material of the semiconductor layer include Cd and Te.

14. The method of claim 13, wherein the material of the semiconductor layer satisfy a condition provided by $Cd_xMn_{1-x}Te_ySe_{1-y}$ with $0 \leq x, y \leq 1$.

15. The method of claim 13, wherein the material of the semiconductor layer further include Zn.

16. The method of claim 15, wherein Hall the material of the semiconductor layer satisfy a condition provided by $Cd_xZn_{1-x}Te_ySe_{1-y}$ with $0 \leq x, y \leq 1$.

17. The method of claim 1, wherein a quantity of each of the materials corresponding to the semiconductor layer, the at least one intermediate level and the at least one contact layer is determined per surface by a duration of a residence time of the respectively used solution.

18. The method of claim 1, wherein the semiconductor layer is only partially wetted with the solution in order to deposit the material of the at least one intermediate layer only at provided regions.

19. The method of claim 18, wherein, for a partial wetting of the semiconductor layer, subareas of the semiconductor layer to be excluded from wetting, are to be covered with a protective layer.

20. The method of claim 1, wherein the at least one intermediate layer, followed outwards by the at least one contact layer, at least partially enclose the semiconductor layer.

21. The method of claim 20, wherein the at least one intermediate layer is embodied differently on sides of the at least intermediate layer.

22. A semiconductor element of a direct-converting x-ray detector, comprising:
   a semiconductor layer formed based on elements of groups II to VI;
   at least one intermediate layer formed on the semiconductor layer based on chemical currentless deposition of material of the at least one intermediate layer from a solution, with which the semiconductor layer is wetted; and
   at least one contact layer formed on the at least one intermediate layer by chemical currentless deposition of a contact material from a solution with which the at least one intermediate layer is wetted, wherein
   materials for the semiconductor layer, the at least one intermediate layer and the at least one contact layer are used such that the electrochemical potential of the material of the at least one intermediate layer is relatively greater than the electrochemical potential of at least one element of the at least one semiconductor layer, and
   the electrochemical potential of the contact material of the at least one contact layer is relatively greater than the electrochemical potential of the material of the at least one intermediate layer.

23. An x-ray detector including a plurality of semiconductor elements, each of the plurality of semiconductor elements comprising:
   a semiconductor layer formed based on elements of groups II to VI;
   at least one intermediate layer formed on the semiconductor layer based on chemical currentless deposition of material of the at least one intermediate layer from a solution, with which the semiconductor layer is wetted; and at least one contact layer formed on the at least one intermediate layer by chemical currentless deposition of a contact material from a solution with which the at least one intermediate layer is wetted, wherein materials for the semiconductor layer, the at least one intermediate layer and the at least one contact layer are used such that the electrochemical potential of the material of the at least one intermediate layer is relatively greater than the electrochemical potential of at least one element of the at least one semiconductor layer, and the electrochemical potential of the contact material of the at least one contact layer is relatively greater than the electrochemical potential of the material of the at least one intermediate layer.

24. An x-ray system, comprising:

an x-ray detector, the x-ray detector including a plurality of semiconductor elements, each of the semiconductor elements including:
- a semiconductor layer formed based on elements of groups II to VI;
- at least one intermediate layer formed on the semiconductor layer based on chemical currentless deposition of material of the at least one intermediate layer from a solution, with which the semiconductor layer is wetted; and
- at least one contact layer formed on the at least one intermediate layer by chemical currentless deposition of a contact material from a solution with which the at least one intermediate layer is wetted, wherein materials for the semiconductor layer, the at least one intermediate layer and the at least one contact layer are used such that the electrochemical potential of the material of the at least one intermediate layer is relatively greater than the electrochemical potential of at least one element of the at least one semiconductor layer, and the electrochemical potential of the contact material of the at least one contact layer is relatively greater than the electrochemical potential of the material of the at least one intermediate layer.

25. A CT-System, comprising:

an x-ray detector, the x-ray detector including a plurality of semiconductor elements, each of the semiconductor elements including:
- a semiconductor layer formed based on elements of groups II to VI;
- at least one intermediate layer formed on the semiconductor layer based on chemical currentless deposition of material of the at least one intermediate layer from a solution, with which the semiconductor layer is wetted; and
- at least one contact layer formed on the at least one intermediate layer by chemical currentless deposition of a contact material from a solution with which the at least one intermediate layer is wetted, wherein materials for the semiconductor layer, the at least one intermediate layer and the at least one contact layer are used such that the electrochemical potential of the material of the at least one intermediate layer is relatively greater than the electrochemical potential of at least one element of the at least one semiconductor layer, and the electrochemical potential of the contact material of the at least one contact layer is relatively greater than the electrochemical potential of the material of the at least one intermediate layer.

* * * * *